United States Patent [19]

Riggs et al.

[11] 4,134,114

[45] Jan. 9, 1979

[54] RADAR SYSTEM HAVING AMPLITUDE AND PHASE MODULATION AND DEMODULATION CIRCUITS

[75] Inventors: Denton D. Riggs, Rancho Palos Verdes; Gene A. Wagner, Torrance, both of Calif.

[73] Assignee: Hughes Aircraft Company, Culver City, Calif.

[21] Appl. No.: 787,405

[22] Filed: Apr. 14, 1977

[51] Int. Cl.$^2$ ............................ G01S 7/28; G01S 9/23
[52] U.S. Cl. ................................. 343/17.2 R; 343/17.5
[58] Field of Search ................... 343/17.2 R, 17.2 PC, 343/17.5

[56] References Cited

U.S. PATENT DOCUMENTS

| 3,460,141 | 8/1969 | Bouman | 343/17.2 PC |
| 3,790,938 | 2/1974 | Anderson et al. | 343/17.2 R |

Primary Examiner—S. C. Buczinski
Attorney, Agent, or Firm—Walter J. Adam; W. H. MacAllister

[57] ABSTRACT

A radar system embodies a subsystem having an amplitude and phase modulator circuit, an amplitude and phase demodulator circuit electrically connected to and feeding the modulator circuit, and a pulse generator electrically connected to and feeding the demodulator circuit. A single traveling wave tube is utilized in the transmitting portion of the subsystem.

16 Claims, 1 Drawing Figure

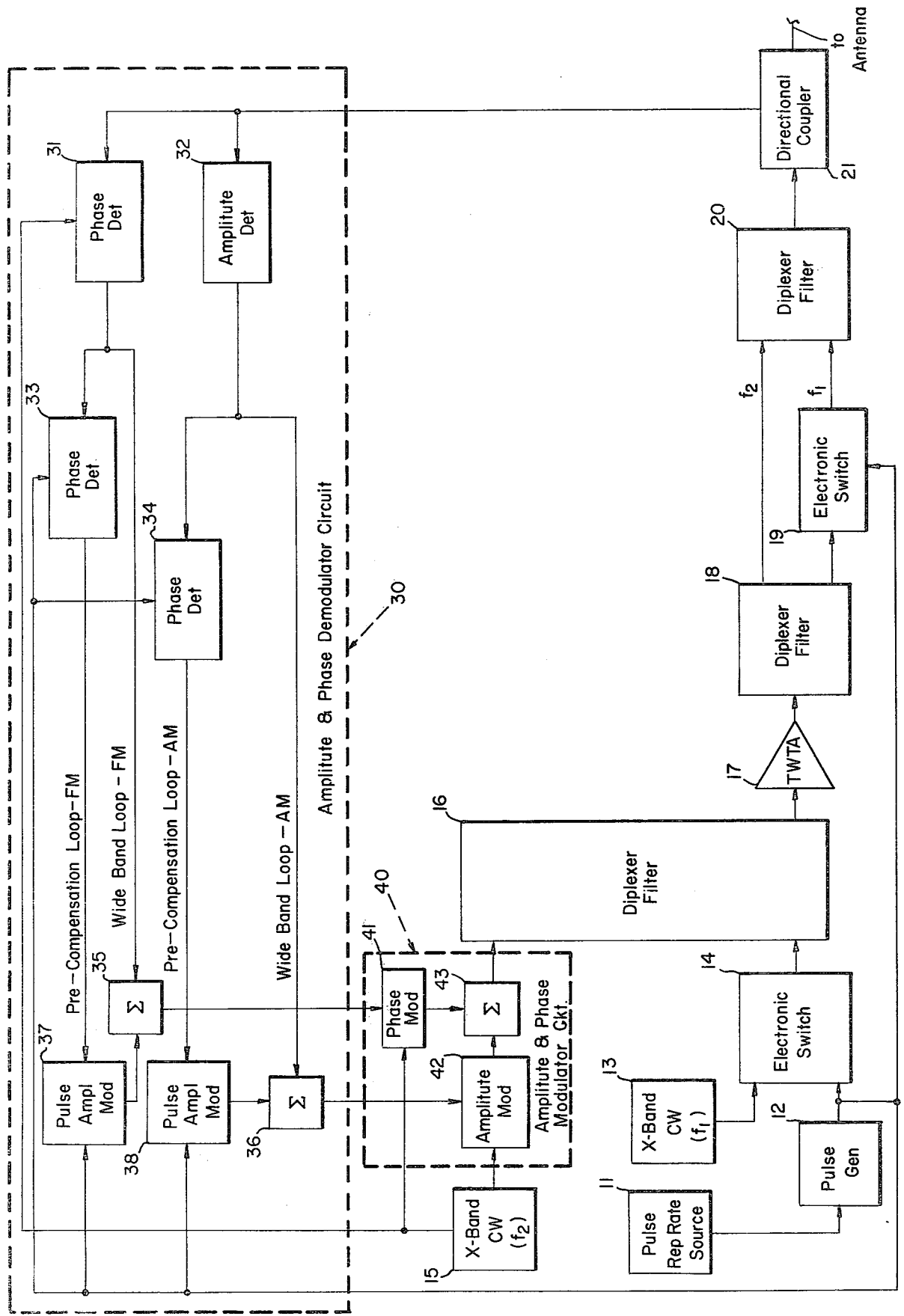

RADAR SYSTEM HAVING AMPLITUDE AND PHASE MODULATION AND DEMODULATION CIRCUITS

BACKGROUND OF THE INVENTION

This invention is in the field of radar systems and particularly in such radar systems employed amplitude and phase modulation and demodulation circuits.

Radar systems having amplitude and phase circuits are known in the art. However, such prior art systems employ high voltage modulators which degragate operating performance of the system.

Additionally such prior art systems utilize a plurality of traveling wave tubes, the use of which increases the complexity of the system, decreases overall performance, and materially increases cost and unreliability.

SUMMARY OF THE INVENTION

Therefore, an object of the invention is to provide a radar system devoid of high voltage modulators.

Another object of the invention is to utilize amplitude and phase modulator and demodulator circuits in conjunction with a pulse generator, which pulse generator is electronically coupled to only a single traveling wave tube amplifier.

Accordingly, a radar system includes a subsystem having an amplitude and phase modulator circuit, an amplitude and phase demodulator circuit electrically connected to and feeding the modulator circuit, and a pulse generator electrically connected to and feeding the demodulator circuit.

The system includes a single traveling wave tube amplifier electronically intermittently coupled to the pulse generator. An electronic switch is electrically connected to and fed by the pulse generator, said electronic switch being electronically coupled to the modulator circuit.

The system includes a first diplexer electrically connected to the electronic switch. It also includes a directional coupler electrically connected to the first diplexer. The directional coupler is electrically connected to the demodulator circuit.

The system also includes a first phase sensitive detector and an amplitude modulation detector, said first phase sensitive detector and amplitude modulation detector being electrically connected to and fed by the directional coupler.

A second phase sensitive detector is provided which is electrically connected to and fed by the first phase sensitive detector, and a third phase sensitive detector is electrically connected to and fed by the amplitude modulation detector. A first summer is electrically fed by the first phase sensitive detector, and a pulse amplitude modulator is electrically connected to and fed by the second phase sensitive detector.

A pulse amplitude modulator is electrically connected to and fed by the third phase sensitive detector, and a second summer is electrically connected to and fed by the pulse amplitude modulator and the amplitude modulation detector.

The amplitude and phase modulator circuit comprises, an amplitude modulator electrically connected to and fed by the second summer, and a phase modulator electrically connected to and fed by the first summer. It also includes a third summer electrically connected to and fed by the phase modulator and the amplitude modulator.

A second diplexer is electrically connected to the first diplexer and feeds the first diplexer and the electronic switch. The traveling wave tube amplifier is electrically connected to the input of the second diplexer, and a third diplexer is electrically connected to the input of the traveling wave tube amplifier.

BRIEF DESCRIPTION OF THE DRAWING

The drawing is an electronic schematic showing the components utilized in a subsystem of a radar system according to the invention.

DETAILED DESCRIPTION

A technique for obtaining pulse doppler and CW waveforms simultaneously from a single traveling wave-tube amplifier is disclosed herein. Amplitude and phase modulation detection and amplitude and phase modulator circuits and a pulse generator are integrally connected.

A pulse repetition rate source 11 establishes the pulse repetition frequency (PRF) for the system). This repetition rate source drives pulse generator 12. The pulse generator establishes the basic pulse width for the system and provides a pulse aiding waveform to the amplitude and phase modulation detection circuit 30. The pulse generator establishes the pulse width needed for gating the system. X-band CW source 13 is provided as an input to electronic switch 14. X-band CW source 13, at frequency $f_1$, establishes the spectral purity of a pulse doppler waveform. The output of electronic switch 14 provides a pulse-doppler RF waveform which is applied to diplexer-filter 16. The function of diplexer-filter 16 is to combine the pulse doppler RF waveform with the modulated CW waveform, hereinbelow described.

The output of the diplexer-filter 16 is applied to the input of traveling-wave-tube-amplifier (TWTA) 17. The function of the TWTA is the amplification of the pulse doppler and CW RF signals to a high power level. Cross-modulation that occurs in the TWTA would ordinarily corrupt the CW spectrum and require that a second TWTA be used for the CW. Method and circuitry used herein cancels cross-modulation components and preserves the CW spectrum with only one TWTA.

The two waveforms are applied to another diplexer-filter 18 following the TWTA. The function of diplexer-filter 18 is to separate the pulse doppler the CW frequencies into two separate channels. The pulse doppler channel is gated by an electronic switch 19 interposed between diplexer 18 and diplexer 20. The function of electronic switch 19 is to suppress the noise between the pulses inputted to diplexer 20, so that the pulse doppler radar receiver (not shown) will be able to respond between pulses. The output of switch 19 is applied to the input of diplexer-filter 20. The function of the diplexer 20 is to recombine frequencies $f_1$ and $f_2$ on to a common line for application to directional coupler 21, which directional coupler 21 samples the energy from the output of diplexer 20. The output spectrum from directional coupler 21 is applied to amplitude and phase modulation detection circuit 30.

Specifically, the output of the directional coupler is applied to phase sensitive detector 31, and amplitude modulation detector 32. The reference input to phase sensitive detector 31 is the X-band CW source having frequency $f_2$ generated at 15. Source 15 providing frequency $f_2$, wherein $f_2$ is higher in frequency than $f_1$, establishes the basic spectral purity for the CW waveform in addition to serving as a reference for phase sensitive detector 31. The function of phase sensitive detector 31 is to detect and amplify the FM modulation on the CW waveform being passed to the antenna, and to phase invert the polarity of the FM modulation. The wideband output of phase sensitive detector 31 is applied to summer 35, and is also applied to phase sensitive detector 33. The reference input to phase sensitive detector 33 is pulse generator 12. The function of phase sensitive detector 33 is to measure the fundamental PRF component of the FM modulation detected by phase sensitive detector 31. This measure of the fundamental component is used to modulate a pulse sample from pulse generator 12. Thus, modulation is performed by passing the output of phase sensitive detector 33 to a pulse amplitude modulator 37 where the other input to modulator 37 is the pulse sample from pulse generator 12.

The function of pulse amplitude modulator 37 is to produce a pulse sample at its output proportional to the amount of fundamental PRF component measured by phase sensitive detector 33. The output of pulse amplitude modulator 37 is applied to the second input of summer 35 where it is summed with the wideband output from phase sensitive detector 31. The output of summer 35 (second control signal) is used to deliberately phase modulate the output of source 15 by means of phase modulator 41. The function of phase modulator 41 is to FM-modulate source 15 with the signal provided by amplitude and phase modulation detection circuit 30 at summer 35 output. The output of phase modulator 41 is then applied to summer 43.

The output of the directional coupler 21 is applied to amplitude modulation detector 32, the function of amplitude modulation detector 32 being to detect and amplify the amplitude modulation of the CW waveform being passed to the antenna, the phase invert the polarity of the detected modulation. The wideband output of amplitude modulation detector 32 is applied to summer 36 and also to phase sensitive dectector 34. The reference input to phase sensitive detector 34 is the pulse from pulse generator 12, and the function of phase sensitive detector 34 is to measure the fundamental PRF component of the amplitude modulation modulation detected by amplitude detector 32. The output of phase sensitive detector 34 is used to control the amplitude of a pulse sample from pulse generator 12. This control is performed in pulse amplitude modulator 38 whose inputs are the output of phase detector 34 and the pulse sample from the pulse generator 12. The function of pulse amplitude modulator 38 is to produce a pulse whose amplitude is controlled by the fundamental PRF component at the output of amplitude modulation detector 32. The output of pulse amplitude modulator 38 is applied to summer 36 where it is summed with the wideband output of amplitude modulation detector 32. The output of summer 36 (first control signal) is used to amplitude modulate source 15, which modulation is performed in amplitude modulator 42. The function of amplitude modulator 42 is to AM-modulate source 15 with the signal provided by the amplitude and phase modulation detection circuit 30 at summer 36 output. The output of amplitude modulator 42 is summed with the output of the phase modulator 41 in summer 43.

The AM and FM-modulation on the CW waveform at the output of summer 43 is equal and opposite to the cross-modulation spectrum imposed on the CW waveform by the pulse in traveling wave tube amplifier 17.

The output of summer 43 is therefore applied to diplexer-filter 16. The function of the diplexer-filter 16 is to combine the modulated CW waveform output from amplitude and phase modulator circuit 40 with the pulse doppler RF waveform from electronic switch 14 which was hereinabove described. The two waveforms are applied to TWTA 17 where the modulation on the CW waveform cancels the cross-modulation generated in the TWTA by the pulse doppler waveform. The CW spectral purity is therefore preserved while using a single TWTA to amplify the pulse doppler RF waveform and CW simultaneously.

The AM pre-compensator loop comprises the output of phase sensitive detector 34, modulator 38, summer 36, modulator 42, summer 43, diplexer 16, TWTA 17, diplexer 18, diplexer 20, coupler 21 and amplitude modulation detector 32. Such loop is used to control the amplitude of the pulse sample from generator 12, which pulse sample is used to pre-compensate for the TWTA amplitude modulated cross-modulation components generated therein.

The FM pre-compensator loop comprises the output of phase sensitive detector 33, modulator 37, summer 35, modulator 41, summer 43, diplexer 16, TWTA 17, diplexer 18, diplexer 20, coupler 21 and phase sensitive detector 31. Such loop is used to control the amplitude of the pulse sample from generator 12, which pulse sample is used to pre-compensate for the TWTA angularly modulated cross-modulation components generated therein.

All components discussed herein may each be found independently in the prior art relating to radar systems.

In the foregoing, it is understood that wherever, phase sensitive detectors or phase detection circuits were referred to, they implied the detection of FM modulation as well as phase modulation. Wherever FM was referred to above, phase modulation is impliedly included.

What is claimed is:

1. A system for simultaneously amplifying within a single microwave power amplifier pulsed signals of a first microwave frequency and a continuous wave signal of a second frequency and for reducing the level of components in the amplified signal which are due to cross-modulation between said continuous wave and pulsed signals, said system comprising:

a source of said continuous wave signal;

a diplexer device adapted for combining two microwave signals;

a modulator adapted for amplitude and phase modulating applied microwave energy in response to first and second applied control signals, said modulator being electrically coupled to receive said continuous wave signal and to apply the resultant modulated continuous wave signal to one input of said diplexer device;

a source of said pulsed microwave signals coupled to the other input of said diplexer device;

a microwave power amplifier coupled to receive the output signal from said diplexer device; and a demodulation circuit coupled to receive a portion of the output energy from said microwave power amplifier, for measuring the amplitude and phase modulation thereon and for providing said first and second control signals as respective functions of said measured amplitude and phase modulation and with the polarities of said control signals being such that the modulation imposed on said continuous wave signal within the modulator is out of phase with cross-modulation components produced within said power amplifier.

2. The system of claim 1 further comprising a second diplexer coupled to receive the output signals from said microwave power amplifier and for applying said continuous wave and pulsed signals to first and second output channels, respectively; an electronic switch coupled in said second output channel; a third diplexer, for combinating applied signals, coupled to receive signals from said first output channel and from the output of said switch and wherein said switch is controlled to interrupt, during the period between pulses of said pulsed microwave signal, energy flow through the second channel.

3. The system of claim 1 wherein said demodulator includes a first and a second phase sensitive detector, a pulse amplitude modulator and a summer circuit; with said first phase sensitive detector being connected to receive a portion of the output energy from said microwave power amplifier as its signal input, and to receive said continuous wave microwave signal as its reference input; with said second phase sensitive detector being connected to receive the output signal from said first phase sensitive detector as its signal input, and to receive a train of pulses having the same repetition rate as said pulsed microwave signals, as its reference input; with said pulse amplitude modulator being connected to receive the output signal from said second phase sensitive detector as its signal input and to receive said train of pulses as its modulating input, with said summer being connected to receive the output signals from said pulse amplitude modulator and from said first phase sensitive detector as its input signals and wherein the output signal from said summer is said second control signal.

4. The system of claim 3 wherein said demodulator includes an amplitude modulation detector, a third phase sensitive detector, a second pulse amplitude modulator and a second summer circuit; with said amplitude modulation detector circuit being connected to receive a portion of the output energy from said microwave amplifier as its signal input; with said third phase sensitive detector being connected to receive the output signal from said amplitude modulation detector as its signal input, and to receive a train of pulses having the same repetition rate as said pulsed microwave signals as its reference signal; with said second pulse amplitude modulator being connected to receive the output signal from said third phase sensitive detector as its signal input and to receive and train of pulses as its modulating input signal; with said second summer being connected to receive the output signals from said second pulse amplitude modulator and from said amplitude modulation detector as its input signals and wherein the output signal from said second summer is said first control signal.

5. A system for amplifying in a single power amplifier, a pulsed signal and a continuous wave signal and for reducing cross-modulation components on said continuous wave signal comprising:
a source of said continuous signal wave;
a source of said pulsed signals;
a modulator circuit coupled to said source of continuous wave signal;
first means coupled to said source of continuous wave signal and to said source of pulsed signals for combining said continuous wave signal and said pulsed signals;
a power amplifier coupled to said first means;
second means coupled to said power amplifier for separating said continuous wave signal and said pulsed signals;
switching means coupled to said second means and to said source of pulsed signals for being switched to suppress noise between said pulsed signals;
third means coupled to said switching means and to said second means for combining the signals therefrom; and
a demodulation circuit coupled to said third means and to said modulator circuit for measuring the amplitude and phase modulation of the signal received from said power amplifier and for providing control signals to said modulator circuit for phase and amplitude modulating said continuous wave signal to reduce said cross-modulation components.

6. The combination of claim 5 in which said demodulation circuit includes a phase correcting loop and an amplitude correcting loop.

7. A system for amplifying a continuous wave signal and a pulsed signal in a common channel while suppressing cross-modulation components comprising:
a source of continuous wave signals;
modulation means coupled to said source of continuous wave signals;
a source of pulsed signals;
combining means coupled to said modulating means and to said source of pulsed signals;
power amplifier means coupled to said combining means; and
demodulating means coupled to said power amplifier means and to said modulating means to receive a portion of the signal energy from said power amplifier means for measuring the phase and amplitude modulation thereon and for providing control signals to said modulating circuit to control said continuous wave signals for suppressing said cross-modulation components.

8. The combination of claim 7 in which said demodulating means includes an amplitude demodulating means and a phase demodulating means and said modulating circuit includes an amplitude modulator and a phase modulator respectively coupled to said amplitude demodulating means and said phase demodulating means.

9. The combination of claim 8 in which said amplitude demodulating means and said phase demodulating means each include a pre-compensation loop and a wide band loop.

10. The combination of claim 7 further comprising:
separating means coupled to said power amplifier for providing said continuous wave signals and said pulsed signals to respective first and second channels;
switching means coupled to said second channel and to said source of pulsed signals for inhibiting signals from passing therethrough except during the period of said pulsed signals; and
second combining means coupled to said second channel and to said switching means for providing a combined signal and coupled to said demodulation circuit for applying a portion of the combined signal thereto.

11. The combination of claim 8 in which said source of pulsed signals includes a pulse generator and said amplitude demodulating means includes a first phase sensitive detector coupled to said pulse generator and said phase demodulating means includes a second phase sensitive detector coupled to said source of continuous wave signals and a third phase sensitive detector coupled to said pulse generator.

12. In a radar system, a subsystem for amplifying a signal in a common channel to be applied to an antenna for transmission and for suppressing cross-modulation components on said signal, comprising:

a source of continuous wave signals;
a source of pulsed signals;
a modulator circuit coupled to said source of continuous wave signals;
combining means coupled to said modulator circuit and to said source of pulsed signals;
a power amplifier coupled to said combining means;
coupler means coupled to said power amplifier and to said antenna; and
a demodulator circuit coupled between said coupler means and said modulator circuit for receiving a portion of the energy from said power amplifier and providing first and second control signals to said modulator circuit, respectively being a function of amplitude and phase modulation and having polarities such that modulation imposed on said continuous wave signals in the modulator circuit is out of phase with cross-modulation components produced within said power amplifier.

13. The combination of claim 12 further comprising:
separating means coupled to said power amplifier for providing said continuous wave signals and said pulsed signals to respective first and second channels;
switching means coupled to said second channel and to said source of pulsed signals for inhibiting signals from passing therethrough except during the period of said pulsed signals; and
second combining means coupled to said second channel and to said switching means and coupled to said demodulating circuit for applying thereto a portion of the energy from said power amplifier.

14. In a radar system, a subsystem for amplifying in a common channel a signal to be transmitted through an antenna, said signal including a continuous wave signal and a pulsed signal, said subsystem suppressing cross-modulation components developed in said common channel comprising:

a source of continuous wave signals;
modulator means coupled to said source of continuous wave signals;
a source of pulsed signals;
combining means coupled to said modulator means and to said source of pulsed signals;
a power amplifier coupled to receive the output signal from said combining means; and
a demodulation circuit coupled to receive a portion of the energy from said power amplifier and coupled to said modulator circuit for providing thereto control signals as a function of said amplitude and phase modulation for suppressing said cross-modulation components.

15. The combination of claim 14 further including means coupled between said power amplifier and said demodulator circuit and coupled to said source of pulsed signals for inhibiting noise between the pulses from passing to said antenna.

16. The combination of claim 15 in which said demodulation circuit includes amplitude demodulating means and phase demodulating means each including a pre-compensation loop and a wide band loop.

* * * * *

UNITED STATES PATENT AND TRADEMARK OFFICE
CERTIFICATE OF CORRECTION

PATENT NO. : 4,134,114

DATED : January 9, 1979

INVENTOR(S) : Denton D. Riggs and Gene A. Wagner

It is certified that error appears in the above—identified patent and that said Letters Patent are hereby corrected as shown below:

Column 5, line 16, "demodulation circuit" instead of "demodulator".

line 38, "demodulation circuit" instead of "demodulator".

line 63, "continuous wave signal;" instead of "continuous signal wave;".

line 64, "signal;" instead of "signals;".

line 67, delete "source of continuous wave" and insert "modulator circuits".

line 68, delete "signal". After "of", insert "a" and after "pulsed" delete "signals" and insert "signal".

Column 6, line 2, delete "signals;" and insert "signal;".

line 6, delete "signals;" and insert "signal;".

line 8, before "pulsed" insert "a", after "pulsed" delete "signals" and insert "signal".

line 15, before "and" delete "amplitude" and insert "phase". After "and" delete "phase" and insert "amplitude".

line 24, delete "a" (second occurrence).

line 24, after "wave" delete "signal" and insert "signals".

UNITED STATES PATENT AND TRADEMARK OFFICE
CERTIFICATE OF CORRECTION

PATENT NO. : 4,134,114

DATED : January 9, 1979

INVENTOR(S) : Denton D. Riggs and Gene A. Wagner

It is certified that error appears in the above-identified patent and that said Letters Patent are hereby corrected as shown below:

Column 6, line 25, after "and" delete "a" and after "pulsed" delete "signal" and insert "signals".

line 28, before "means" delete "modulation" and insert "modulating".

line 40, after "modulating" delete "circuit" and insert "means".

line 46, before "includes" delete "circuit" and insert "means".

line 54, after "amplifier" insert "means".

line 62, after "said" delete "second" and insert "first".

line 65, before "circuit" delete "tion" and insert "ting means".

Column 8, line 3, after "said" delete "second" and insert "first".

line 5, after "said" delete "demodulating" and insert "demodulator".

line 9, after "including" delete "a" and after "wave" delete "signal" and insert "signals".

line 10, after "and" delete "a" and after "pulsed" delete "signal," and insert "signals,".

UNITED STATES PATENT AND TRADEMARK OFFICE
CERTIFICATE OF CORRECTION

PATENT NO. : 4,134,114

DATED : January 9, 1979

INVENTOR(S) : Denton D. Riggs and Gene A. Wagner

It is certified that error appears in the above-identified patent and that said Letters Patent are hereby corrected as shown below:

Column 8, line 21, before "circuit" delete "demodulation" and insert "demodulator".

line 23, after "demodulator" delete "circuit" and insert "means".

line 24, before "amplitude" delete "said".

line 33, before "circuit" delete "modulation" and insert "modulator".

Signed and Sealed this

Seventh Day of August 1979

[SEAL]

Attest:

LUTRELLE F. PARKER
*Attesting Officer*   *Acting Commissioner of Patents and Trademarks*